Aug. 12, 1969 J. J. HARRIS 3,461,396

COMPENSATED TRANSISTOR AMPLIFIER

Filed March 8, 1965

INVENTOR.
JAMES J. HARRIS
BY

Richard K. Macneill

United States Patent Office 3,461,396

Patented Aug. 12, 1969

3,461,396
COMPENSATED TRANSISTOR AMPLIFIER

James J. Harris, San Diego, Calif., assignor, by mesne assignments, to Solitron Devices, Inc., Tappan, N.Y., a corporation of New York Filed Mar. 8, 1965, Ser. No. 437,665
Int. Cl. H03f 7/00, 3/68, 1/38
U.S. Cl. 330—30 5 Claims

ABSTRACT OF THE DISCLOSURE

There is provided a circuit wherein one amplifier is connected to another amplifier in such a manner that the first mentioned amplifier provides for temperature compensated operation of the second amplifier.

Figure 1:
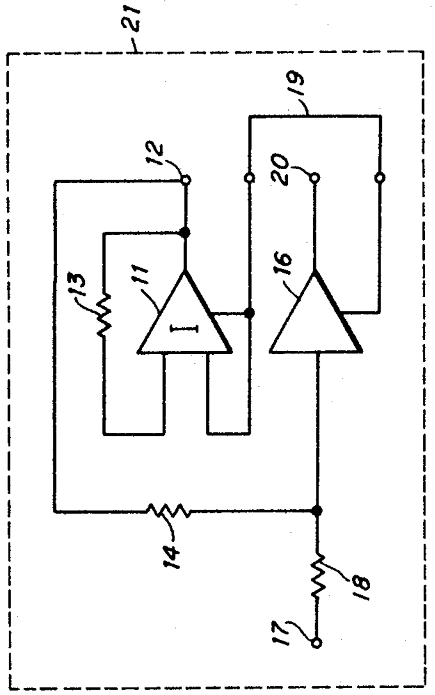

The present invention relates to a compensated transistor amplifier, and more particularly, to a compensated transistor amplifier, which is compensated for a variation in input current requirements because of changes in ambient physical environment.

A problem exists in amplifier utilizing solid state devices, such as transistors, in the supplying of a normal bias current required by the input element of the input solid state amplifiers, unless the parameters of the ambient environment are controlled. Examples of these normally varying parameters are temperature and, radiation and the like. Control of these parameters is often very difficult and expensive, and even impossible in some applications, thereby resulting in reduced reliability and increased cost. Consequently, it is desirable to supply circuitry which compensates for the effect of the varying parameters.

According to the invention, an inverting, operational amplifier with a resistive feedback from output to input is supplied in the same environment as the amplifier to be compensated. When properly designed, the inverting amplifier will have an output which varies directly as the variations of inut current requirements to the amplifier to be compensated, since the two solid state amplifiers are in the same environment and subject to the same variations. A portion of the output from the inverting amplifier is coupled into the input base element of the solid state amplifier to be compensated, supplying the variation in base current requirements caused by variations in environmental parameters. Thus, the inverting amplifier compensates for the effects of the variations in environmental parameters.

An object of the present invention is the provision of a solid state amplifier which is compensated for variations in environmental parameters.

Another object is to provide a solid state amplifier having a compensating amplifier subject to the same environmental changes.

A further object of the invention is the provision of a compensated solid state amplifier which is inexpensive, simple in design, and requires a minimum of maintenance and adjustment.

Figure 2:
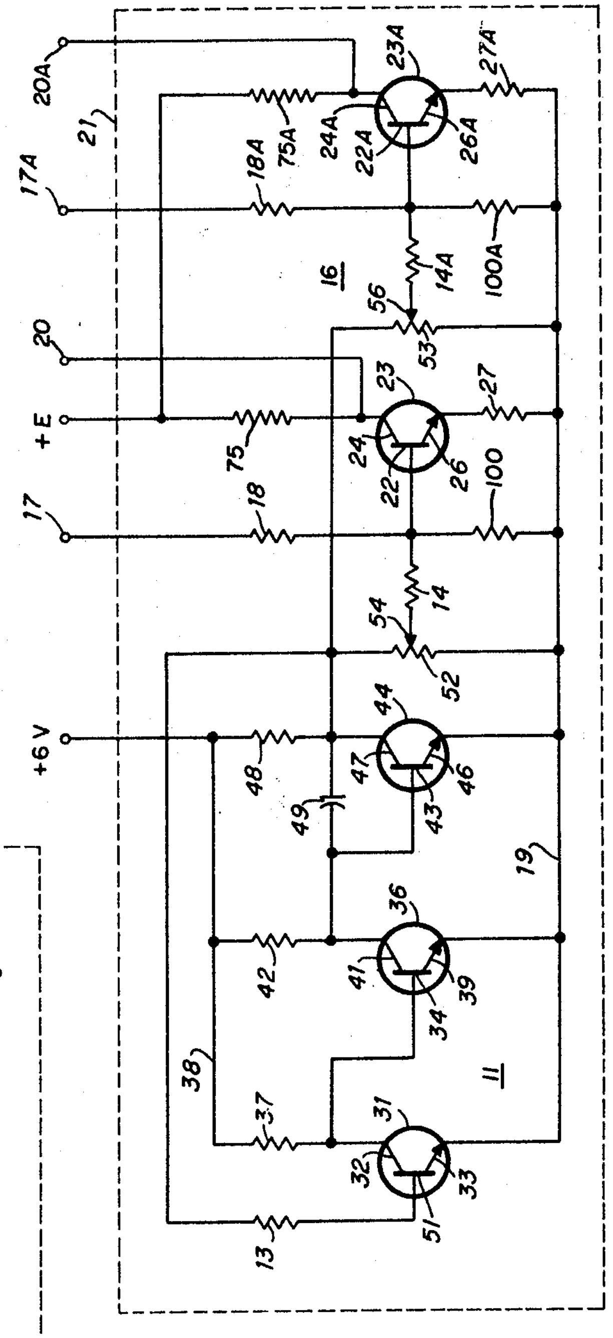

Other objects and many of the attendant advantages of this invention will be readily appreciated as the same becomes better understood by reference to the following detailed description, when considered in connection with the accompanying drawings in which like reference numerals designate like parts throughout the figures thereof, and wherein:

FIG. 1 illustrates in block and schematic form a general embodiment of the present invention; and FIG. 2 illustrates in schematic form a more specific embodiment of the present invention.

In FIG. 1, inverter amplifier 11 has output terminal 12 connected through resistance 13 back to an input of inverter amplifier 11. Output terminal 12 is also connected through resistance 14 to an input of amplifier 16. Input terminal 17 is connected through resistance 18 to an input of amplifier 16. Reference bus 19, for example ground, is connected to a reference input of amplifier 11, and a reference input of amplifier 16. As shown, the other input of a differentially connected amplifier 11 is connected to reference bus 19. Dotted lines 21 indicate a common physical environment of amplifiers 11 and 16.

Referring to FIG. 2, input terminals 17 and 17A are connected through resistances 18 and 18A respectively to bases 22 and 22A, respectively, of transistors 23 and 23A, respectively. In addition, bias resistors 100 and 100A are connected from the bases 22 and **22*a*, respectively, to reference bus 19. Transistors 23 and 23A have collectors 24 and 24A and emitters 26 and 26A, respectively. Emitters 26 and 26A are connected through resistances 27 and 27A, respectively, to reference bus 19. Collectors 24 and 24A are connected to a suitable source, for example +E, via resistors 75 and 75A, respectively. Moreover, collectors 24 and 24A are connected to output terminals 20 and 20A, respectively. Of course, transistors 23 and 23A and the associated components represent the compensated amplifier 16** (and counterparts in a differential configuration).

Transistor 31 has collector 32 and emitter 33 connected to reference bus 19. Collector 32 of transistor 31 is connected to base 34 of transistor 36 and through resistance 37 to positive potential bus 38. Emitter 39 of transistor 36 is connected to reference bus 19 and collector 41 of transistor 36 is connected through resistance 42 to positive bus 38. Collector 41 is also connected to base 43 of transistor 44. Emitter 46 of transistor 44 is connected to reference bus 19 and collector 47 of transistor 44 is connected through resistor 48 to positive bus 38. Capacitor 49 is connected between collector 41 of transistor 36, and collector 47 of transistor 44.

Feedback resistance 13 is connected between collector 47 of transistor 44, and base 51 of transistor 31. Collector 47 of transistor 44 is also connected through parallel resistances 52 and 53 to reference bus 19. Sliding contact 54 on resistance 52 is connected through resistance 14 to base 22 of transistor 23. Sliding contact 56 on resistance 53 is connected through resistor 14A to base 22A of transistor 23A.

Operation

Although the instant compensation technique will compensate for many environmental changes such as moisture, temperature, radiation, and the like, the following explanation will be directed to temperature variation compensation, since this is the most common environmental problem. It is to be understood, of course, that even though the discussion refers to temperature variation, it is equally applicable to many environmental parameter variations.

Referring to FIG. 1, amplifier 16 is the amplifier to be compensated. The input to transistor amplifier 16 is supplied at terminal 17 and the output taken at terminal 20. Inverter amplifier 11 is physically located in the same environment with amplifier 16, as indicated by dotted lines 21. Amplifier 11 has its output taken at terminal 12 relative to and common bus 19. This output is applied to the input of transistor amplifier 16 via resistor 14. The output of inverter amplifier 11, also a transistor amplifier, will vary according to environmental changes, and in the case of temperature increase, the output will decrease. The same time the input current requirements to the input transistor of amplifier 16 at its base element will decrease with an increase of temperature to maintain a constant output at output terminal 20. This input current requirement decrease will vary in the same proportion as the output level at terminal 12 of inverter amplifier 11, since amplifiers 11 and 16 are subjected to the same environmental change. A portion of this output is then fed back through resistor 13 to the base element of the input transistor of amplifier 16, thus supplying this decrease of base current requirements of the input transistor of amplifier 16, and maintaining the output level at output terminal 20 constant.

Referring to FIG. 2, transistors 23 and 23A represent the input transistors of a differential DC amplifier, representative of amplifier 16, to be compensated. Transistors 31, 36 and 44, together with their associated circuitry, represent the inverter amplifier utilized for compensation. Dotted lines 21 again indicate a common environment for the entire circuitry.

If transistor 31 is subjected to temperature variations, then its base current, and correspondingly the output voltage, will increase at low temperature and decrease at high temperature relative to the initial condition. The high gain of the second and third states (transistors 36 and 44) constrains the collector current of transistor 31 to a nearly constant value.

The signal level of the collector 47 of transistor 44 will then vary directly with a temperature change. This level is applied across output resistances 52 and 53, and detected at contacts 54 and 56, respectively. Resistances 14 and 14A are extremely large (in the order of 20 megohms) for a conversion to a current supply, and are connected directly to bases 22 and 22A of the input transistors of a differential amplifier 16. Each of the sliding contacts is varied independently for a desired level at the output 20 or 20A of each side of the differential amplifier, and the initial value or level of collector 47 can be set by varying feedback resistance 13 or collector resistance 37.

It should be understood, of course, that the foregoing disclosure relates to only preferred embodiments of the invention, and that it is intended to cover all changes and modifications of the examples of the invention herein chosen for the purposes of the disclosure which do not constitute departures from the spirit and scope of the invention.

What is claimed is:

1. A compensated solid state amplifier comprising:
solid state amplifying means having an input element adapted for direct coupling to a signal of interest;
said solid state amplifying means disposed in a predetermined physical environment wherein operation of said solid state amplifying means may be varied in response to temperature variations in said physical environment; and
an inverting DC solid state amplifier having an output signal level which varies as a function of the operation thereof;

said inverting DC amplifier disposed in the same physical environment as said solid state amplifying device wherein operation of said inverting DC amplifier may be varied in response to said temperature variations in said physical environment;
said output signal level of said inverting DC amplifier being coupled to said solid state amplifying means input element whereby any variation in input current requirements of said solid state amplifying means caused by said temperature variations in said physical environment will be supplied by variations in said inverting DC amplifier output level.

2. The compensated solid state amplifier of claim 1 wherein said inverting DC amplifier and solid state amplifying means each have input and output terminal means,
feedback means connected in parallel with said inverting DC solid state amplifier,
input means connected to said input terminal means of said solid state amplifying means,
and means connecting said output terminal means of said inverting DC solid state amplifier to said input terminals of solid state amplifying means in order to provide signals from said inverting DC solid state amplifier to said solid state amplifying means to compensate for variations in the operation thereof due to environmental conditions.

3. The combination recited in claim 2 wherein at least one of said first and second amplifying means is a differential amplifier.

4. The combination recited in claim 2 wherein said means connecting the output terminal means of said first amplifying means to the input terminal means of said second amplifying means comprises a pair of potentiometers connected in parallel, the variable tap of each of said potentiometers connected to a different input terminal of the input terminal means of said second amplifying means.

5. The combination recited in claim 2 wherein said first amplifying means includes a plurality of stages, each of said stages including at least one transistor.

References Cited

UNITED STATES PATENTS

| | | | |
|---|---|---|---|
| 2,369,066 | 2/1945 | Maxwell | 330—85 XR |
| 2,977,547 | 3/1961 | Talambiras | 330—69 |
| 3,346,817 | 10/1967 | Walker et al. | 330—30 X |

ROY LAKE, Primary Examiner

LAWRENCE J. DAHL, Assistant Examiner

U.S. Cl. X.R.

330—26